United States Patent
Mohanty (10) Patent No.: US 10,236,186 B2
(45) Date of Patent: Mar. 19, 2019

(54) METHODS FOR DRY HARD MASK REMOVAL ON A MICROELECTRONIC SUBSTRATE

(71) Applicant: Tokyo Electron Limited, Minato-ku, Tokyo (JP)

(72) Inventor: Nihar Mohanty, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/819,071

(22) Filed: Aug. 5, 2015

(65) Prior Publication Data

US 2016/0042969 A1 Feb. 11, 2016

Related U.S. Application Data

(60) Provisional application No. 62/033,347, filed on Aug. 5, 2014.

(51) Int. Cl.
*H01L 21/3065* (2006.01)
*H01L 21/308* (2006.01)
(Continued)

(52) U.S. Cl.
CPC .......... *H01L 21/31122* (2013.01); *C23F 4/00* (2013.01); *H01L 21/02057* (2013.01);
(Continued)

(58) Field of Classification Search
None
See application file for complete search history.

(56) References Cited

U.S. PATENT DOCUMENTS 6,194,323 B1 * 2/2001 Downey ........... H01L 21/31116
216/47
6,399,508 B1 6/2002 Ting et al.
(Continued)

OTHER PUBLICATIONS

Lee et al., "Etch Defect Characterization and Reduction in Hard-Mask-Based Al Interconnect Etching", International Journal of Plasma Science and Engineering, 2008, pp. 1-5, Article ID 154035, Hindawi Publishing Corporation, Module Process Development Division, Technology Development Center, Macronix International Company, Ltd., (MD420) No. 16, Li-Hsin Road, Science-Based Industrial Park, Hsinchu 300, Taiwan.
(Continued)

*Primary Examiner* — Stephanie P Duclair
(74) *Attorney, Agent, or Firm* — Oblon, McClelland, Maier & Neustadt, L.L.P.

(57) ABSTRACT

The disclosure relates to methods for a multi-step plasma process to remove metal hard mask layer from an underlying hard mask layer that may be used to implement a sub-lithographic integration scheme. The sub-lithographic integration scheme may include iteratively patterning several features into the metal hard mask layer that may be transferred to the hard mask layer. However, the iterative process may leave remnants of previous films on top of the metal hard mask that may act as mini-masks that may interfere with the pattern transfer to the hard mask layer. One approach to remove the mini-masks may be to use a two-step plasma process that removes the mini-mask using a first gas mixture ratio of a carbon-containing gas and a chlorine-containing gas. The remaining metal hard mask layer may be removed using a second gas mixture ratio of the carbon-containing gas and the chlorine-containing gas.

20 Claims, 4 Drawing Sheets

(51) Int. Cl.
  *H01L 21/3105* (2006.01)
  *B81C 1/00* (2006.01)
  *H01L 21/311* (2006.01)
  *H01L 21/3213* (2006.01)
  *C23F 4/00* (2006.01)
  *H01L 21/02* (2006.01)

(52) U.S. Cl.
  CPC ...... *H01L 21/3065* (2013.01); *H01L 21/3081* (2013.01); *H01L 21/31056* (2013.01); *H01L 21/31116* (2013.01); *H01L 21/31144* (2013.01); *H01L 21/32136* (2013.01); *H01L 21/32139* (2013.01); *B81C 1/00595* (2013.01)

(56) References Cited

U.S. PATENT DOCUMENTS

| | | |
|---|---|---|
| 6,969,685 B1 | 11/2005 | Li et al. |
| 2011/0130007 A1 | 6/2011 | Ching et al. |
| 2011/0162674 A1* | 7/2011 | Tang ................ H01J 37/32091 134/1.1 |
| 2011/0303639 A1 | 12/2011 | Ng et al. |
| 2014/0179106 A1 | 6/2014 | Zhong et al. |
| 2014/0299571 A1 | 10/2014 | Sawataishi et al. |

OTHER PUBLICATIONS

Cui et al., "Metal Hardmask Etch Residue Removal for Advanced Copper / Low-k Devices", 2007 IEEE/SEMI Advanced Semiconductor Manufacturing Conference, 2007, pp. 366-370, DuPont / EKC Technology, DuPont Electronic Technologies, 2520 Barrington Court. Hayward, CA USA 94545.

Posseme et al., "In situ plasma treatments as a solution for porous SiOCH patterning using metallic hard mask", PESM, Mar. 4-5, 2010, pp. 1-24, Grenoble.

TIPO Notification of Examination Opinions, dated Jan. 4, 2107 in corresponding TW Application No. 104125330.

* cited by examiner

METHODS FOR DRY HARD MASK REMOVAL ON A MICROELECTRONIC SUBSTRATE

CROSS REFERENCE TO RELATED APPLICATIONS

The present application claims the benefit of U.S. provisional patent application No. 62/033,347, filed on Aug. 5, 2014 which is incorporated herein by reference in its entirety.

FIELD OF THE DISCLOSURE

This invention relates to semiconductor processing technology, and more particularly, to apparatus and methods for plasma treating films on a semiconductor substrate.

BACKGROUND

The geometries of microelectronic features continue to scale to smaller sizes and increase in complexity. Accordingly, the patterning techniques used to manufacture microelectronic devices have become more precise to create smaller features and minimize damage to the films during manufacturing. Scaling to smaller light wavelengths for photolithography has been a successful approach to manufacture smaller devices. However, light wavelength scaling has reached some limitations that may be overcome by using sub-lithographic techniques such as multiple patterning (MP) or self-aligned double/quadruple patterning (SADP/SAQP). Although sub-lithographic techniques have extended device manufacturing to smaller geometries, they have also introduced processing complexity that may reduce device yield or increase manufacturing cost. The process complexity may include additional film layers that may need to be removed and reapplied to enable smaller device features. Incomplete removal of film layers may have a negative impact on sub-lithographic patterning. Hence, removing film layers to eliminate residual traces of overlying films on underlying films may improve patterning results. Accordingly, new processing techniques that may overcome the aforementioned issues may be desirable.

SUMMARY

Described herein are methods for plasma processing of a microelectronic substrate being used in the patterning flow for semiconductor manufacturing for back end of line (BEOL) and middle of line (MOL) layers. In absence of EUV lithography, this necessitates the use of sub-lithographic techniques with 193 nm lithography. Typical sub-lithographic techniques employed for MOL/BEOL patterning are: multiple patterning (MP); and self-aligned double/quadruple patterning (SADP/SAQP). Depending on the design rules one or the other patterning technique is preferred, for example if the local interconnects demands bi-directional lines, then MP may be preferred. The MP integration scheme is merely provided as an exemplary embodiment and is not intended to limit the claim scope to the MP integration scheme.

In one embodiment, the integration scheme for the sub-lithographic patterning may include a film stack that may include an underlying and overlying organic layers with one or more hard mask layers disposed between the organic layers. In this instance, the hard mask layer may be used to pattern the underlying organic layer using sub-lithographic techniques. However, the hard mask layer may include two layers, where the first hard mask layer closest to the overlying organic layer may be used to pattern the second hard mask layer that may be closest to the underlying organic layer. The overlying hard mask layer may be patterned several times before the pattern is transferred to the underlying hard mask layer and, in turn, the underlying hard mask layer pattern may be transferred to the underlying organic layer. In some instances removing the overlying hard mask layer may be necessary after pattern transfer onto the underlying hard mask layer. However, in some instances, the removal of the overlying hard mask layer may be incomplete which may interfere with the eventual pattern transfer onto the underlying organic layer. One common root cause of this incomplete overlying hard mask removal is due to remaining overlying organic layer on top of first hard mask. Accordingly, the removal of the organic layer remnants on the first hard mask layer and the first hard mask layer itself may be achieved by a two-step plasma etch process of the overlying hard mask layer.

In one embodiment, the method for treating a substrate may include receiving the substrate in a plasma processing chamber, the substrate comprising an a titanium-containing layer above an organic-containing layer, and a hard mask layer disposed between the organic-containing layer, wherein the hard mask layer may be an oxide layer, silicon nitride layer, or silicon carbide layer. Under the sub-lithographic integration scheme the titanium-containing layer may be patterned to expose portions of the underlying hard mask layer. Prior to patterning the organic layer using the hard mask layer, the titanium-containing layer may be removed using a two-step plasma etch process. For example, in the first step plasma may use a first ratio of a gas mixture comprising a chlorine-containing gas and a carbon-containing gas followed by a second ratio of the gas mixture to remove the titanium-containing layer and expose the hard mask layer. The gas mixture may include one or more of the following gases $CH_4$, $C_2H_4$, $Cl_2$, $BCl_3$, or $CCl_4$. In one specific embodiment, the first ratio between the chlorine-containing gas and the carbon-containing gas may be about 6:0.25 and the second ratio may be about 3:0.13.

In another embodiment, the treatment of the titanium-containing layer includes a gas mixture of a chlorine-containing gas, a nitrogen-containing gas, a carbon-containing gas and a argon-containing gas with a first ratio of 6:1:0.25:8. The second step of the treatment may include the same or similar gases using a second ratio of 3:0:0:0.13:4.

In one embodiment of the aforementioned embodiments, the process pressure 10 mTorr to 30 mTorr and power between 100 W to 1000 W that is applied to at least one electrode in the plasma process chamber. In another embodiment, the treatment may include a pressure between 10 mTorr to 30 mTorr, a temperature up to 100 C, a power between 100 W to 1000 W and a process time of up to 150 s.

In one specific embodiment, the plasma treatment chamber may include a top electrode and a bottom electrode that may receive different power levels during the treatment. In this embodiment, the pressure may be about 15 mTorr with a top electrode power of about 350 W, a bottom electrode power of about 30 W for a time of about 30 s.

In another specific embodiment, the plasma treatment chamber may include a top electrode and a bottom electrode that may receive different power levels during the treatment. In this embodiment, the pressure may be about 20 mTorr with a top electrode power of about 350 W, a bottom electrode power of about 30 W for a time of about 90 s.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Described herein are methods for plasma processing of a microelectronic substrate being used in the patterning flow for semiconductor manufacturing for back end of line (BEOL) and middle of line (MOL) layers. In absence of EUV lithography, this necessitates the use of sub-lithographic techniques with 193 nm lithography. Typical sub-lithographic techniques employed for MOL/BEOL patterning are: multiple patterning (MP); and self-aligned double/quadruple patterning (SADP/SAQP). Depending on the design rules one or the other patterning technique is preferred, for example if the local interconnects demands bi-directional lines, then MP may be preferred. The MP integration scheme is merely provided as an exemplary embodiment and is not intended to limit the claim scope to the MP integration scheme. One embodiment of a MP integration scheme that may include a memorization layer where multiple patterns are stitched before transferring onto a final hard mask (HM) layer. Metal compound based memorization layers, known as metal hard masks (MHM) may be used due to their excellent corner retention and good selectivity with respect to the underlying final HM. The most commonly used MHM memorization layer is TiN, but the scope of this disclosure may include other metal layers besides TiN such as TiOx, WOx, ZrOx, AlOx.

Figure 1:
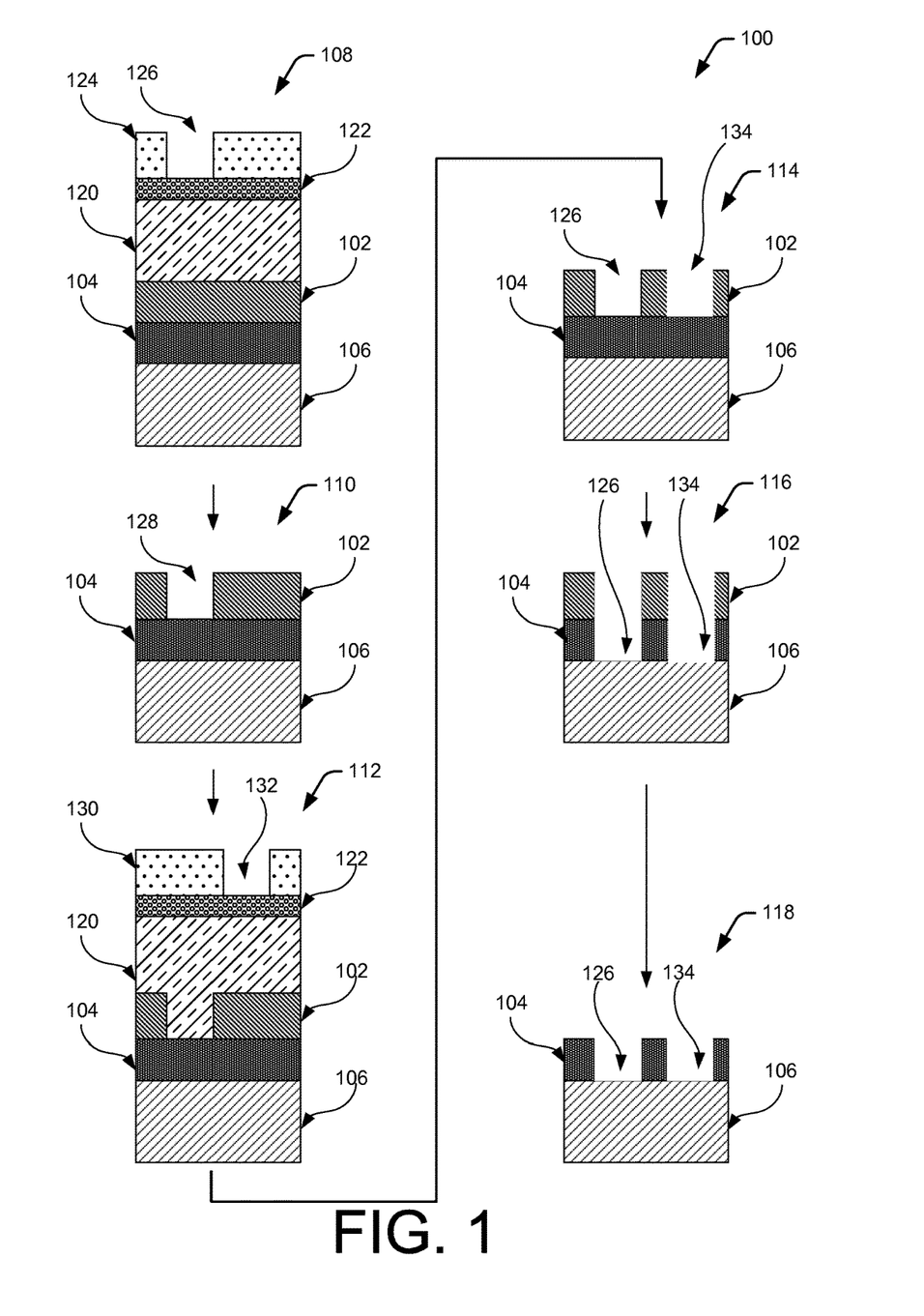
FIG. 1 is an illustration of a multiple patterning integration scheme to pattern a hard mask layer on a microelectronic substrate according to at least one embodiment.

FIG. 1 illustrates one embodiment of an integration scheme or process flow 100 for multiple-pattering using a MHM 102 and a HM 104 that may include stitching the multiple lithography exposures on to the MHM 102 to expose and pattern the HM 104 and then transfer the HM 104 pattern to the underlying organic layer 106. The process flow may begin with the initial film stack 108 that may be used, iteratively, to pattern several features into the MHM 102. The initial film stack 108 may include the underlying organic layer 106, the HM layer 104, the MHM layer 102, an overlying organic layer 120, an anti-reflective coating (ARC) layer 122, and a first patterned resist layer 124 that includes the initial pattern 126 that will be transferred to the MHM 102 using known photolithography and etch techniques to form the first pattern stack 110. As shown in FIG. 1, the first MHM pattern 128 may be the same or similar to the initial pattern 124 in the photoresist layer 124.

The first pattern stack 110 is an example of one completed iteration of the multiple patterning technique that may be used to pattern the MHM 102. After the first MHM pattern 128 is completed, the process may begin again and the overlying organic layer 120, the ARV layer 122, and a second patterned resist layer 130 that includes a second pattern 132 that may be different than the initial pattern 124 that was transferred to the MHM layer 102. The second film stack 112 may be used to transfer the second pattern 132 to the MHM layer 102 using the same or similar techniques that were to treat the initial film stack 108. However, the result may be different as shown in the second MHM stack 114 where the second MHM pattern is located in a different position than the initial pattern 132. In some embodiments, the distance between the first MHM pattern 132 and the other stitched patterns (e.g., second MHM pattern 132) in the MHM layer 102 may be measured in nanometers. FIG. 1 shows at least two iterations of the MHM 102 patterning that may repeated many times to complete the pattern that may be transferred to HM 104 layer.

When the MHM pattering is completed, a plasma etch process may be used to form the final MHM/HM film stack 116 that transfers the completed pattern to the HM 104 layer in a single etch process that uses the MHM layer 102 as a mask layer. However, the HM 104 etch process may be selective to the underlying organic layer 106, such that the completed MHM pattern may not be transferred the underlying organic layer 106. A different etch process may be used to etch the underlying organic layer 106, but the MHM layer 102 may need to be removed prior to the organic layer etch process. The aforementioned etch process may be implemented using known techniques to a person of ordinary skill in the art of plasma processing.

One aspect of the MP integration scheme is constant application and removal of the overlying organic layer 120 on the MHM layer 102. In certain instances, portions of the overlying organic layer 120 may not be completely removed when the MHM/HM film stack 116 is formed. Hence, the exposed top surface of the substrate may have two or types of materials that may be exposed MHM 102 removal plasma process. The MHM layer 102 and the remnants of the overlying organic layer 120 may have different etch rates that may cause portions (not shown) of the MHM layer 102 to remain on the HM layer 104 when the final HM film stack 118 is formed. If the remnants are not removed, they may act as micro-masks that may be transferred to the HM layer 104 as portions of the MHM layer 102 that were not removed due to the difference in the etch rates between the MHM layer 102 and the remnants of the overlying organic layer 120.

In one approach, a wet chemical process may be used to remove the remnants of the overlying organic layer 120 prior to the MHM etch process. However, this substrate may be transferred to a different tool to the wet chemical process that may increase cost and cycle time. Another approach may be to use a plasma etch process to remove the remnants in the same process tool that removes the MHM layer 102. A two-step plasma process may be used to remove the organic remnants in the first step followed by a second step that removes the MHM layer 102.

Figure 2:
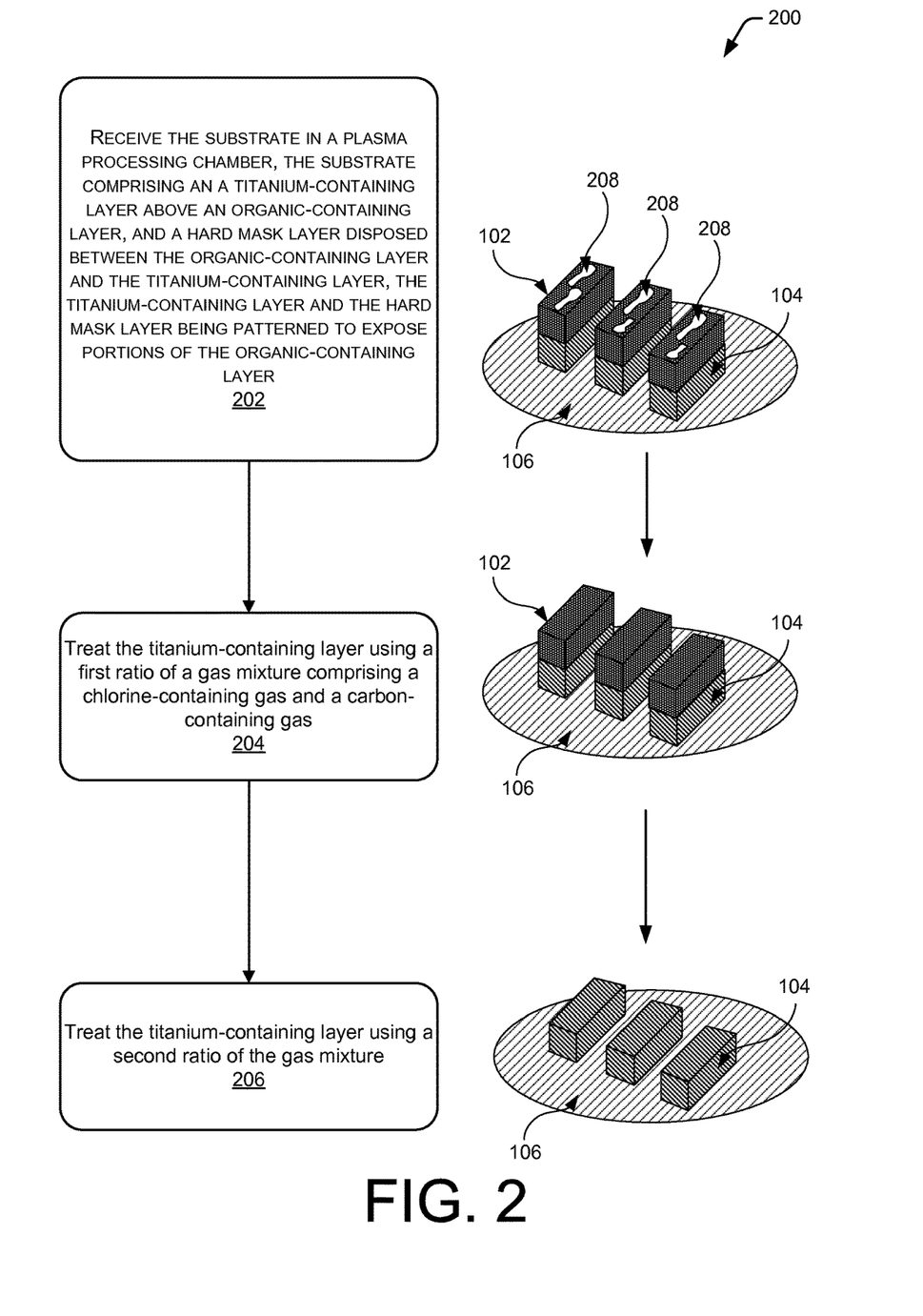
FIG. 2 illustrates a flow diagram for a method for treating a metal containing layer in the multiple patterning integration scheme and accompanying illustrations according to at least one embodiment.

FIG. 2 illustrates a flow diagram for a method 200 that includes a two-step approach for an in-situ dry etch process for the MHM layer 102 that may be used to obtain a final HM layer 104 that is free of residue (e.g., organic remnants) and little surface damage. To the right of the flow diagram are illustrations one embodiment of the MHM/HM film stack 116 that may be exposed to the two-step process to form the final HM film stack 118.

At block 202, the plasma chamber may receive a substrate including a titanium-containing layer (e.g., MHM 102) above an organic-containing layer (e.g., underlying organic layer 106) and a hard mask layer (e.g., HM layer 104) disposed between the organic-containing layer and the titanium-containing layer. In one embodiment, the titanium-containing layer and the hard mask layer may be patterned to expose portions of the organic-containing layer. In one embodiment, the hard mask layer may include, but is not limited to, an oxide layer, a silicon nitride layer, or a silicon carbide layer. The organic-containing layer may include, but is not limited to, OPL (organic planarizing layer), SOC (spin on carbon), SOH (spin on organic hard mask), APF (amorphous carbon), In some embodiments, the titanium-containing layer may include a residue 208 or remnants from previous processing, as described in the description of FIG. 1. The residue 208 may not be uniformly applied across the titanium-containing layer and may be intermittently distributed with varying thicknesses and heights. In one specific embodiment, the residue 208 may be a fluorocarbon that may interfere with the removal of the titanium-containing layer. The fluorocarbon material may operate as mini-mask layer that may result in non-uniform removal from the hard mask layer.

One approach to remedy the residue 208 problem may be to stage the titanium removal into two parts, such that the first part may remove the residue 208 to remove the mini-mask. The second step may be the titanium removal process that clears the titanium from the surface of the hard mask layer 104.

At block 204, the residue 208 may be treated by generating plasma within the plasma chamber using a first ratio of a gas mixture that may include, but is not limited to, a chlorine-containing gas and a carbon-containing gas. In this way, the plasma may remove the residue (e.g., fluorocarbons) from a surface of the titanium-layer and may remove a small portion of the titanium-containing layer. In one embodiment, the carbon-containing may include, but is not limited to, $CH_4$ or $C_2H_4$ and the chlorine-containing gas may include, but is not limited to, one of the following: $Cl_2$, $BCl_3$, or $CCl_4$. In one specific embodiment, the first gas mixture may include a ratio of about 6:0.25 between the chlorine-containing gas and the carbon-containing gas. The plasma may be generated using a pressure between 10 mTorr to 30 mTorr and a power between 100 W to 1000 W that may be applied to at least one electrode in the plasma process chamber.

In another specific embodiment, the first ratio of the gas mixture may further include a nitrogen-containing gas and an argon-containing gas, in addition to the chlorine-containing gas and the carbon-containing gas. The first ratio for this gas mixture may be about 6:1:0.25:8 of the chlorine-containing gas, nitrogen-containing gas, the carbon-containing gas and the argon-containing gas. The N and H species from the plasma enable the removal of the fluorocarbon layer and modify the titanium-containing layer's surface for efficient removal of the remaining TiN in the second step. An optimized mixture of $Cl2/C_xH_y$ with appropriate Ar dilution may be used as the second step for dry removal of titanium-containing layer. Co-optimization of the first step and the second step may ensure residue free, complete removal of MHM layer 102 with minimal impact on HM layer 104.

In the embodiments above, the process conditions for the plasma may also vary to account for different variations in residue 208 coverage. Several different process embodiments may be used to treat the residue 208. In one embodiment, the plasma chamber may be maintained at a pressure between 10 mTorr to 30 mTorr. The substrate chuck, upon which the substrate is placed during processing, may be maintained at a temperature of up to 100 C. and electrode power between 100 W to 1000 W for a process time of up to 150 s.

In another embodiment, the plasma chamber may include a top electrode disposed above the substrate and a bottom electrode disposed below the substrate. In this instance, the plasma chamber pressure may be about 15 mTorr with about 350 W applied to the top electrode and about 50 W applied to the bottom electrode for a process time of about 30 s.

Following the removal of the residue 208, the patterned stack may look like the second figure adjacent to the block 206. As shown, the mini-masks have been removed and the patterned stack is prepared to receive the second step of the process in the same plasma chamber.

At block 206, the plasma chamber may transition from the first gas ratio to a second ratio of the gas mixture that may be used to remove the titanium-containing layer from the hard mask layer. In one embodiment, the gas mixture may include, but is not limited to, the chlorine-containing gas and the carbon-containing gas at about a ratio of 3:0.13 between the chlorine-containing gas and the carbon-containing gas. The plasma may be generated using a pressure between 10 mTorr to 30 mTorr and a power between 100 W to 1000 W that may be applied to at least one electrode in the plasma process chamber.

Several different process embodiments may be used to remove the titanium-containing layer. In one embodiment, the plasma chamber may be maintained at a pressure between 10 mTorr to 30 mTorr. The substrate chuck, upon which the substrate is placed during processing, may be maintained at a temperature of up to 100 C and an electrode power between 100 W to 1000 W for a process time of up to 150 s.

In one specific embodiment, the plasma chamber may include a top electrode disposed above the substrate and a bottom electrode disposed below the substrate. Different power levels may be applied to each electrode to optimize plasma conditions during the removal process. In this embodiment, the plasma chamber may be maintained at a pressure of about 20 mTorr. The top electrode may receive an applied power of about 350 W and the bottom electrode may receive an applied power of about 30 W for up to 90 s.

In another embodiment, the gas mixture may include other gases in addition to the chlorine-containing gas and the carbon-containing gas. For example, the other gases may include, but are not limited to, argon and/or nitrogen. In this instance, the above process conditions may be applied when the gas ratio mixture is about 3:0.0:0.13:4 for a chlorine-containing gas, nitrogen-containing gas, the carbon-containing gas and the argon-containing gas.

Following the second gas mixture plasma, the titanium-containing layer may be removed from the hard mask layer as shown in the third illustration of FIG. 2. At this point, the hard mask layer is ready to act as a mask layer for the plasma treatment of the underlying organic layer 106. The pattern of the hard mask layer 104 will be transferred to the underlying organic layer 106 by the organic etch process.

Figure 3:
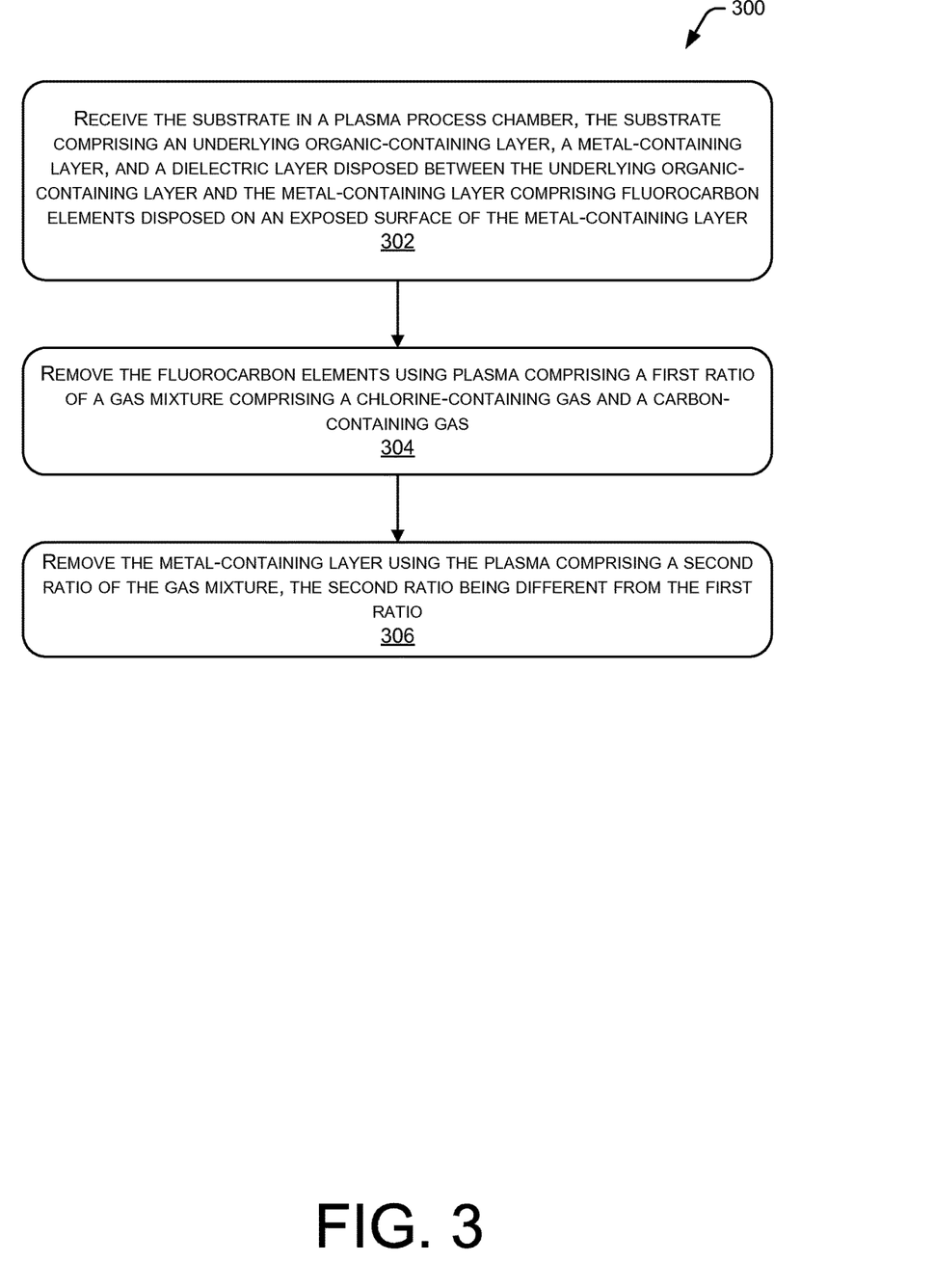
FIG. 3 illustrates a flow diagram for another method for treating a metal containing layer in the multiple patterning integration scheme and accompanying illustrations according to at least one embodiment.

FIG. 3 illustrates a flow diagram for a method 300 that includes a two-step approach to remove fluorocarbons from the surface of the MHM layer 102 and then to remove the MHM layer 102 from the HM layer 104.

At block 302, the plasma chamber may receive a substrate comprising an underlying organic-containing layer 106, a metal-containing layer (e.g., MHM layer 102), and a dielectric layer (e.g., HM layer 104) disposed between the underlying organic-containing layer and the metal-containing layer. In this embodiment, the metal containing layer may include, but is not limited to, TiN and fluorocarbon elements disposed on an exposed surface of the metal-containing layer. The dielectric layer may include, but is not limited to, an oxide layer, a silicon nitride layer, or a silicon carbide layer.

In this embodiment, the fluorocarbon elements may be the residue of films that may have been disposed on the surface of the metal-containing layer, as illustrated in FIG. 1, that may not have been completely removed prior to entering the plasma chamber. In one instance, the fluorocarbon elements may have a different etch rate than the underlying metal-containing layer. Hence, it may be beneficial to remove the fluorocarbon elements before attempting to remove the metal-containing layer to avoid leaving remnants of the metal-containing layer on the dielectric layer.

At block 304, the plasma chamber may be used to remove the fluorocarbon elements by generating a first plasma using a first gas mixture of a chlorine-containing gas and a carbon-containing gas. The chlorine-containing gas may include, but is not limited to, $Cl_2$, $BCl_3$ or $CCl_4$ and the carbon-containing gas may include, but is not limited to, $CH_4$ or $C_2H_4$. In one embodiment, the first ratio may be about 6:0.25 between the chlorine-containing gas and the carbon-containing gas. Other embodiments for the first step treatment may be similar to the process conditions discussed in the description of block 204. Other embodiments for the first step treatment may be similar to the process conditions discussed in the description of block 204.

Following the removal of the fluorocarbon elements, the first plasma may also be used to pre-treat the surface of the metal-containing layer to prepare for the second plasma that will remove the remaining metal-containing layer from the underlying dielectric layer.

At block 306, the plasma chamber may transition to a second plasma treatment that may remove the metal-containing layer using a second ratio of the gas mixture, the second ratio being different from the first ratio. In one embodiment, the second gas ratio may be any ratio that is different from the gas mixture ratio embodiments described in the described in the description of block 304. However, in one specific embodiment, the second gas mixture may include a ratio of about 3:0.13 between the chlorine-containing gas and the carbon-containing gas. Other embodiments for the second step treatment may be similar to the process conditions discussed in the description of block 206.

Figure 4:
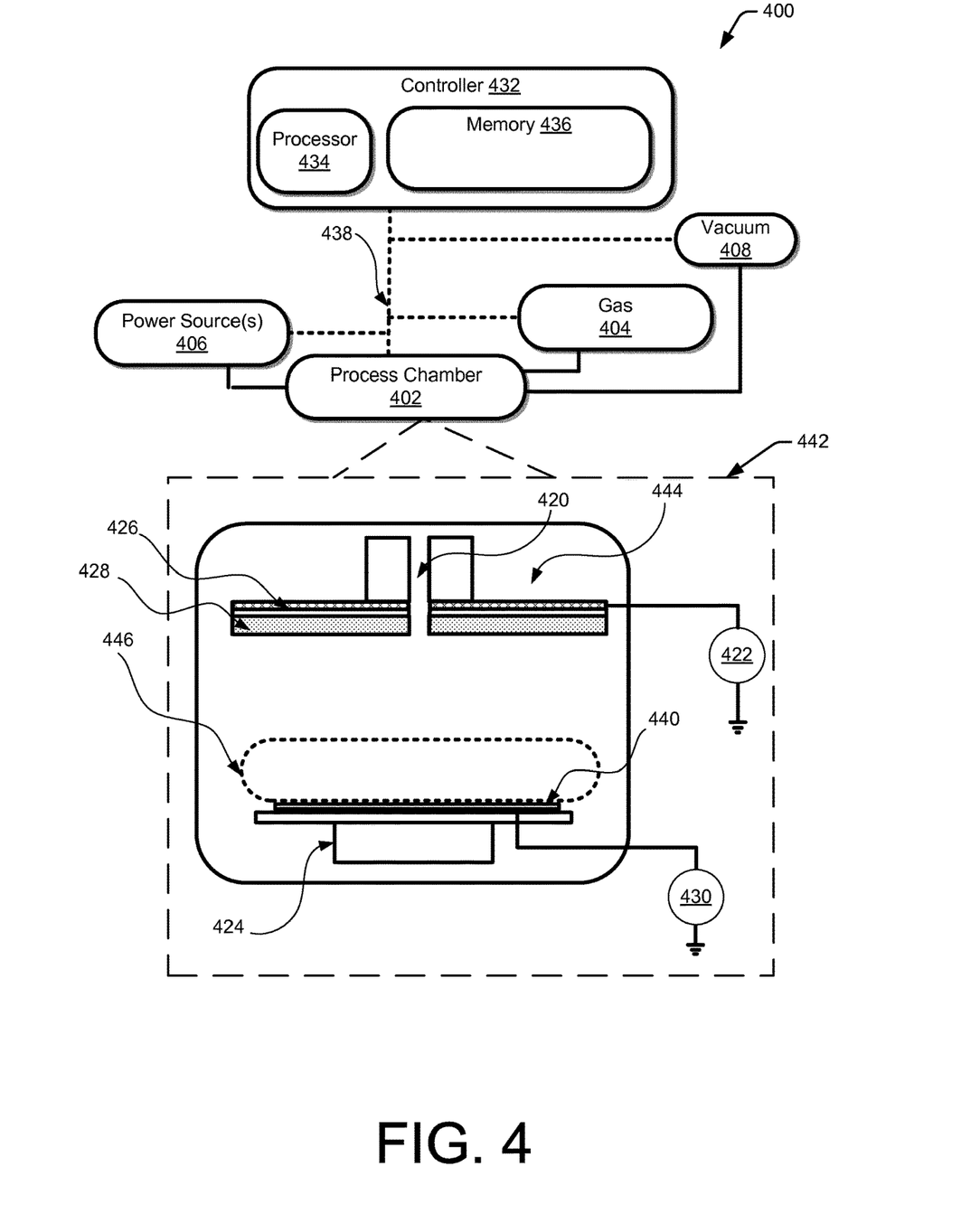
FIG. 4 is schematic representation of a plasma processing system that shows a schematic cross-sectional illustration of a plasma chamber that may enable the transition between a first plasma and a second plasma.

FIG. 4 depicts a plasma processing system 400 for treating substrates using plasma (not shown) that may be generated in a plasma chamber 402. Plasma may be generated by applying electromagnetic energy (e.g., power sources 406) to a process gas mixture that is provided by a gas delivery system 404 to the plasma chamber 402. The gas delivery system 404 may include mass flow controllers, check valves, and the like to be used control gas mixture distribution. A vacuum system 408 in fluid communication with the plasma chamber 402 may also maintain a sub-atmospheric pressure during plasma generation. The vacuum system 408 may include one or more pumps and control systems (e.g., $N_2$ ballast system, butter-fly valve system) to control the pressure within the plasma chamber 402.

Plasma generation may be done by applying electromagnetic energy to an electrically neutral gas to cause electrons to be released from a gas molecules that are positively charged (e.g., ion) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral, positive, or negative charge and may have high chemical reactivity relative to the ions. Over time, the electromagnetic energy and the increasing electron collisions within the gas mixture may increase the density of ionized molecules and radicals within the gas mixture that may be used to treat the substrate 410.

The plasma chamber system 400 may alter certain process conditions to influence the amount of flow of ions and/or radicals towards the substrate, such that the ionized molecules may be influenced by potential differences within the plasma chamber 402. For example, the potential differences within the plasma chamber 402 may direct the ionized molecules (or atoms, or radicals) towards a substrate 410. The ions and radicals may interact with the substrate or treat the substrate through deposition or passivation that alters the surface of the substrate or that may remove a portion of the substrate following the deposition or passivation.

In FIG. 4, the plasma chamber 402 cross section illustration 412 illustrates one embodiment of a power source assembly 414 that enables the transmission of electromagnetic energy (e.g., microwave energy, RF energy) and the gas mixture (not shown) into the region proximate to the substrate 410. The gas mixture may be introduced into the plasma processing region 416 that is proximate to the substrate holder 424, along the gas pathway 420 through the center of the power source assembly 114. In other embodiments, the gas mixture may be introduced from other locations within the plasma chamber 402. The plasma processing region 416 may also receive energy from a first energy source 422 to generate plasma that may be used to treat a substrate 410 disposed on the substrate holder 424. The electromagnetic energy may include electromagnetic energy (e.g., microwave energy @>300 MHz and/or radio-frequency (RF) energy @<300 MHz) that may transmitted, in some way, from the power source 406 to the power source assembly 414. In the FIG. 4 embodiment, the power source assembly 414 may include a microwave waveguide 426 and the dielectric component 428 may be disposed around the gas pathway 418. In other embodiments, the power source assembly 414 may include an antenna plate (not shown) that may be arranged in a way that enables current to flow around the power assembly 414 in a plane that may be substantially parallel to the substrate 410. The current may be induced to flow between a RF power source (not shown) and the ground terminal (not shown) along a low impedance path (e.g., metal layer) and generate a magnetic field (not shown) around the low impedance path that may be used to generate plasma in the plasma processing region 416 or generate plasma in a region above 416 and transmit plasma to the plasma processing region 416.

The gas mixture in the plasma processing region 416 may also receive electromagnetic energy from a second source (e.g., bias power source 430) that may bias the substrate holder 424 and influence the plasma characteristics proximate to the substrate 410. In some embodiments, as will be described in greater detail in the description below, the bias power source 430 and the first power source 422 may be operated in unison or alone to generate plasma within the plasma processing region 416. In one embodiment, the bias power source 430 may be an RF power source that may provide more than 50 W of power at 10 MHz or higher. The biasing of the substrate holder 424 and the power assembly 414 may be implemented by using a controller 432 that may coordinate the process sequencing that enables plasma generation within the plasma processing region 416.

The controller 432 may use a computer processor 434 and memory 436 to execute computer-readable instructions that may be provided over an electrical communication network 438 to control the plasma processing system 400 components (e.g., power sources 406, gas delivery 404, etc.). The one or more computer processors 434 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 436 may include one or more computer-readable storage media ("CRSM"). In some embodiments, the one or more memories may include non-transitory media such as random access memory ("RAM"), flash RAM, solid state media, and so forth. Broadly, the controller 432 may control the sequencing of processing events that enable plasma generation or to transition between different types of plasma that may be exposed to the substrate 410.

It should be understood that the foregoing description is only illustrative of the invention. Various alternatives and modifications can be devised by those skilled in the art without departing from the invention. Accordingly, the present disclosure is intended to embrace all such alternatives, modifications and variances that fall within the scope of the appended claims.

What is claimed is:

1. A method for treating a substrate, comprising:
receiving the substrate in a plasma processing chamber, the substrate comprising a titanium-containing layer above an organic-containing layer, and a hard mask layer disposed between the organic-containing layer and the titanium-containing layer, the titanium-containing layer and the hard mask layer being patterned to expose portions of the organic-containing layer;
treating the titanium-containing layer using a first ratio of a gas mixture comprising a chlorine-containing gas and a carbon-containing gas; and
treating the titanium-containing layer using a second ratio of the gas mixture.

2. The method of claim 1, wherein the treating using the first ratio removes fluorocarbons from a surface of the titanium-layer and a portion of the titanium-containing layer.

3. The method of claim 2, wherein the treating using the second ratio exposes the organic-containing layer by removing the titanium-containing layer.

4. The method of claim 1, wherein the first ratio of the gas mixture comprises a ratio of about 6:0.25 between the chlorine-containing gas and the carbon-containing gas.

5. The method of claim 1, wherein the second ratio of the gas mixture comprises a ratio of about 3:0.13 between the chlorine-containing gas and the carbon-containing gas.

6. The method of claim 1, wherein the first ratio of the gas mixture further comprises a nitrogen-containing gas and an argon-containing gas, the first ratio comprising the chlorine-containing gas, nitrogen-containing gas, the carbon-containing gas and the argon-containing gas at about 6:1:0.25:8.

7. The method of claim 1, wherein the second ratio of the gas mixture further comprises a nitrogen-containing gas and an argon-containing gas, the second ratio comprising the chlorine-containing gas, nitrogen-containing gas, the carbon-containing gas and the argon-containing gas at about 3:0.0:0.13:4.

8. The method of claim 1, wherein the carbon-containing gas comprises at least one of the following: CH4 or C2H4 and the chlorine-containing gas comprises at least one of the following: Cl2, BCl3, or CCl4.

9. The method of claim 1, wherein the hard mask layer comprises oxide, silicon nitride, or silicon carbide.

10. The method of claim 1, wherein the treating of the titanium-containing layer comprises a pressure between 10 mTorr to 30 mTorr and power between 100 W to 1000 W that is applied to at least one electrode in the plasma process chamber.

11. The method of claim 1, wherein the treating of the titanium-containing layer comprises a pressure between 10 mTorr to 30 mTorr, a temperature up to 100 C, power between 100 W to 1000 W and a process time of up to 150 s.

12. The method of claim 1, wherein the hard mask layer comprises oxide, silicon nitride, or silicon carbide.

13. A method for treating a substrate, comprising:
receiving the substrate in a plasma processing chamber, the substrate comprising a titanium-containing layer above an organic-containing layer, and a hard mask layer disposed between the organic-containing layer and the titanium-containing layer, the titanium-containing layer and the hard mask being patterned to expose portions of the organic-containing layer;
treating the titanium-containing layer using a first ratio of a gas mixture comprising a chlorine-containing gas and a carbon-containing gas; and
treating the titanium-containing layer using a second ration of the gas mixture, wherein the treating of the substrate using the first gas ratio further comprises:
a pressure of about 15 mTorr in the plasma process chamber comprisin a top electrode and a bottom electrode;
a top electrode power of about 350 W;
a bottom electrode power of about 30 W; and
a treatment time of about 30 s.

14. The method of claim 13, wherein the treating of the substrate using the second gas ratio further comprises:
a pressure of about 20 mTorr in the plasma process chamber comprising a top electrode and a bottom electrode;
a top electrode power of about 350 W;
a bottom electrode power of about 30 W; and
a treatment time of about 90 s.

15. A method for treating a substrate, comprising:
receiving the substrate in a plasma process chamber, the substrate comprising an underlying organic-containing layer, a metal-containing layer, and a dielectric layer disposed between the underlying organic-containing layer and the metal-containing layer comprising fluorocarbon elements disposed on an exposed surface of the metal-containing layer;
removing the fluorocarbon elements using plasma comprising a first ratio of a gas mixture comprising a chlorine-containing gas and a carbon-containing gas; and
removing the metal-containing layer using the plasma comprising a second ratio of the gas mixture, the second ratio being different from the first ratio.

16. The method of claim 15, wherein the first ratio of the gas mixture comprises a ratio of about 6:0.25 between the chlorine-containing gas and the carbon-containing gas.

17. The method of claim 15, wherein the second gas mixture comprises a ratio of about 3:0.13 between the chlorine-containing gas and the carbon-containing gas.

18. The method of claim 15, wherein the carbon-containing gas comprises at least one of the following: CH4 or C2H4.

19. The method of claim 18, wherein the chlorine-containing gas comprises at least one of the following: Cl2, BCl3 or CCl4.

20. The method of claim 15, wherein the dielectric layer comprises oxide, silicon nitride, or silicon carbide.

* * * * *